United States Patent
Hayakawa

[19]
[11] Patent Number: 4,737,703
[45] Date of Patent: Apr. 12, 1988

[54] VARIABLE PHASE SHIFTING CIRCUIT
[75] Inventor: Mitsuru Hayakawa, Iwai, Japan
[73] Assignee: Victor Company of Japan, Ltd., Yokohama, Japan
[21] Appl. No.: 54,939
[22] Filed: May 27, 1987
[30] Foreign Application Priority Data May 29, 1986 [JP] Japan ................... 61-124179

[51] Int. Cl.⁴ ............................................. G01R 25/00
[52] U.S. Cl. .................................... 323/213; 323/217; 307/262; 328/155
[58] Field of Search ..................... 323/212, 213, 217; 307/262; 328/155

[56] References Cited
U.S. PATENT DOCUMENTS

| 3,056,921 | 10/1962 | Flarity | 323/213 X |
| 3,436,647 | 4/1969 | Gobeli et al. | 323/217 |
| 3,530,365 | 9/1970 | Peugh | 323/213 X |
| 3,876,934 | 4/1975 | Okada et al. | 323/217 |
| 4,039,930 | 8/1977 | Lukas | 323/213 |

Primary Examiner—Peter S. Wong
Attorney, Agent, or Firm—Michael N. Meller

[57] ABSTRACT

A variable phase shifting circuit comprising a phase splitter for distributing an input signal supplied thereto into first and second output signals which are outputted therefrom and 90 degrees out of phase each other, a first double balanced differential amplifier to which the first output signal from said phase splitter is delivered as a first input signal, a second double balanced differential amplifier to which the second output signal from said phase splitter is delivered as a second input signal, a summer for summing the respective first and second output signals from said first and second double balanced differential amplifiers to output the summed result, a converter for converting a control input supplied thereto to a differential current, first logarithmic conversion means for converting said differential current of said converter to a first logarithmic voltage, circular function conversion means for converting said differential current of said converter to a circular function current, and second logarithmic conversion means for converting said circular function current of said circular function conversion means to a second logarithmic voltage, thus to control the gain of said first double balanced differential amplifier respective to said first logarithmic voltage, and to control the gain of said second double balanced differential amplifier responsive to said second logarithmic voltage, thereby to provide a phase controlled output signal from said summer.

4 Claims, 4 Drawing Sheets

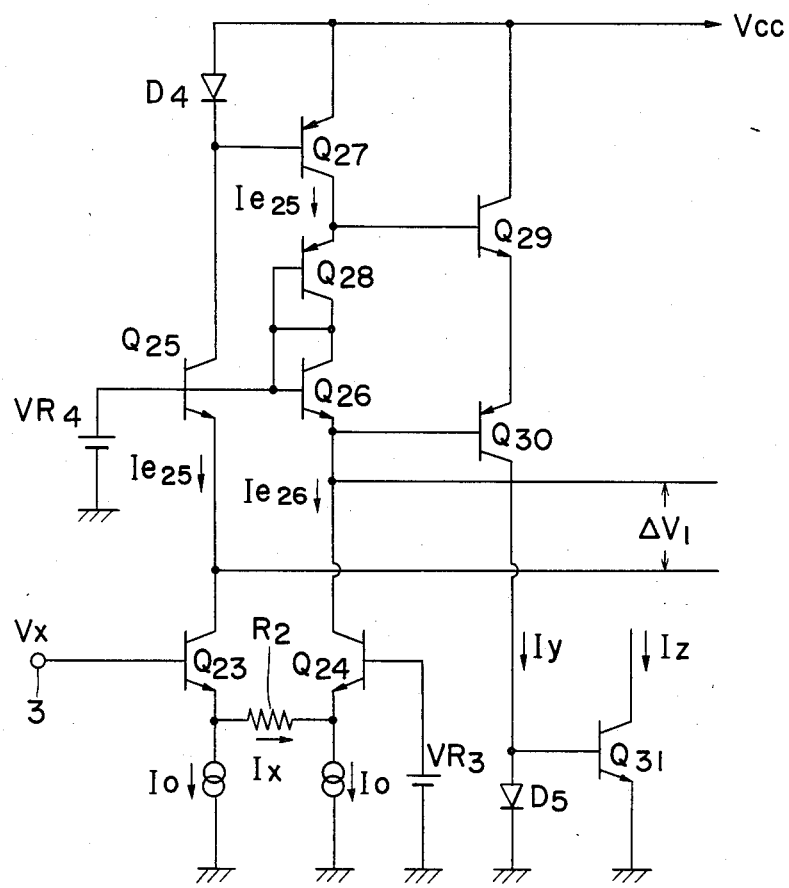
F I G. 6

VARIABLE PHASE SHIFTING CIRCUIT

BACKGROUND OF THE INVENTION

The present invention relates to a variable phase shifting circuit which is capable of controlling the phase of an output signal with respect to an input signal suitable for use in electronic equipment by a control voltage (or current).

Prior to the present invention, there has been known in the art a circuit to deliver an input voltage to a phase shifter of plus (+) 45 degrees and a phase shifter of minus (−) 45 degrees to deliver their outputs to two sets of differential amplifiers to which the same control voltage is supplied, thus to take out the resultant output of these differential amplifiers.

However, the drawbacks with this background art circuit are that the phase shift range is limited to 90 degrees from +45 to −45 degrees and the amplitude also varies according as the phase shift angle changes.

SUMMARY OF THE INVENTION

An object of the present invention is to provide a variable phase shifting circuit which is capable of shifting the phase over a range broader than 90 degrees, and which has no possibility that the amplitude changes in dependence upon the phase shift angle.

To achieve this object, the present invention provides a variable phase shifting circuit comprising a phase splitter for distributing an input signal into first and second signals which are 90 degrees out of phase to output them, a first double balanced differential amplifier to which a first output signal from the phase splitter is delivered as an input signal, a second double balanced differential amplifier to which a second output signal from the phase splitter is delivered as an input signal, a summer for summing respective output signals from the first and second double balanced differential amplifiers to output the summed result, a converter for converting a control input to differential currents, first logarithmic conversion means for converting an output current of the converter to a logarithmic voltage, circular function conversion means for converting the output current of the converter to circular function, and second logarithmic conversion means for converting an output current of circular function conversion means to a logarithmic voltage, thus to control the gain of the first double balanced differential amplifier using an output from the first logarithmic conversion means and to control the gain of the second double balanced differential amplifier using an output from the second logarithmic conversion means, thereby to provide a phase controlled output signal from the summer. Thus, the drawbacks with the background art can be solved by the provision of the phase shift circuit featured above.

DETAILED EXPLANATION OF THE INVENTION

Background Art

FIG. 7 is a circuit diagram of an example of a voltage controlled phase shifting circuit illustrated as an example of the background art variable phase shifting circuit. This circuit was disclosed in Japanese Published Patent Application No. 50-1977. The voltage controlled phase shifting circuit of the background art configuration shown in FIG. 7 includes a signal input terminal 1, a signal output terminal 2, an input terminal 3 for a control voltage, a phase shifter of +45 degrees designated at 12, and a phase shifter of −45 degrees designated at 13 wherein an input signal $V_i$ is delivered to the two phase shifters of 45 degrees through the input terminal 1.

The phase shifter 12 delivers an output signal $V_a$ obtained by shifting the phase of a signal input thereto by an angle of +45 degrees to the base of a transistor $Q_a$. In addition, the phase shifter 13 delivers an output signal $V_b$ obtained by shifting the phase of the signal input thereto by an angle of −45 degrees to the base of a transistor $Q_b$.

Thus, the transistors $Q_a$ and $Q_b$ of which emitters are grounded through individual emitter resistors $R_a$ output currents $i_a$ and $i_b$ in correspondence with the signals $V_a$ and $V_b$ delivered to their bases, respectively. In the circuit configuration shown in FIG. 7, indication of the base bias voltages for the transistors $Q_a$ and $Q_b$ is omitted for the brevity of the explanation.

The above-mentioned current $i_a$ flowing in the transistor $Q_a$ branches at control transistors $Q_c$ and $Q_d$. Likewise, the above-mentioned current $i_b$ flowing in the transistor $Q_b$ branches at control transistors $Q_e$ and $Q_f$. In this circuit, a control voltage $V_x$ delivered to the input terminal 3 for the control voltage is applied to the bases of the above-mentioned transistors $Q_d$ and $Q_e$. In addition, a reference voltage $V_R$ is applied from a reference power source VR to the bases of the above-mentioned transistors $Q_c$ and $Q_f$. Thus, the currents separately flowing in the respective transistors $Q_c$ to $Q_f$ vary in accordance with the control voltage $V_x$. The current flowing in the transistor $Q_d$ and the current flowing in the transistor $Q_f$ are summed by causing them to flow through a load resistor $R_b$ common thereto. Thus, an output signal $V_o$ is output to the output terminal 2.

The phase control operation of the voltage controlled phase shifting circuit of the background art shown in FIG. 7 will be explained with reference to FIG. 8. It is now assumed that the branch ratio in respect of the transistor $Q_d$ in the control transistors $Q_c$ and $Q_d$ at which the current $i_a$ of the transistor $Q_a$ branches is represented by p ($0 \leq p \leq 1$) and the branch ratio in respect of the transistor $Q_f$ in the control transistors $Q_e$ and $Q_f$ at which the current $i_b$ of the transistor $Q_b$ branches is represented by q ($0 \leq q \leq 1$). Thus, the output current of the transistor $Q_d$ is expressed as p $i_a$ and the output current of the transistor $Q_f$ is expressed as q $i_b$. As a result, a current flowing through the load resistor $R_b$ is expressed as p $i_a$+q $i_b$. In this case, since the above-mentioned branch ratios p and q are commonly controlled by the control voltage $V_x$, so that they complementarily changes, the branch ratios have the relationship expressed as p+q=1.

Accordingly, when the relationship between the control voltage $V_x$ and the reference voltage $V_R$ of the reference voltage source VR is expressed as $V_x > V_R$, the branch ratios p and q satisfy the relationship expressed as p>q. When the relationship therebetween is expressed as $V_x = V_R$, they satisfy the relationship expressed as p=q. Further, when the relationship therebetween is expressed as $V_x < V_R$, they satisfy the relationship expressed as p<q.

As stated above, the output current $i_a$ of the transistor $Q_d$ has a phase angle of +45 degrees with respect to the input voltage $V_i$ and the output current $i_b$ of the transistor $Q_f$ has a phase angle of −45 degrees with respect to the input voltage $V_i$. Thus, the center phase of the output voltage $V_o$ varies, as shown in FIG. 8, within a range of ±45 degrees with respect to the input voltage $V_i$ in accordance with the above-mentioned branch ratios p and q.

The Problems With the Background Art

As obvious from the vector diagram shown in FIG. 8, the output voltage $V_o$ output from the voltage controlled phase shifting circuit of the background art has a characteristic such that its phase varies according as the control voltage changes and its amplitude also varies at the same time. As a result, the amplitude at the both ends of the phase control range is increased to a value obtained by multiplying the amplitude at the central position of the phase control range by $\sqrt{2}$, and the phase control range is limited to substantially ±45 degrees.

While the voltage controlled phase shifting circuit exhibiting such a phase control characteristic is applicable to a voltage controlled oscillator etc., this circuit cannot be used as a phase shifting circuit in the application field in which it is required that the signal phase can be arbitrarily controlled and the amplitude of the output voltage does not change still at the time when the signal is subjected to phase control.

BRIEF DESCRIPTION OF THE DRAWINGS

FIG. 6 is a circuit diagram showing another example of a part of the configuration of the variable phase shifting circuit according to the present invention;

EMBODIMENT

Figure 1:
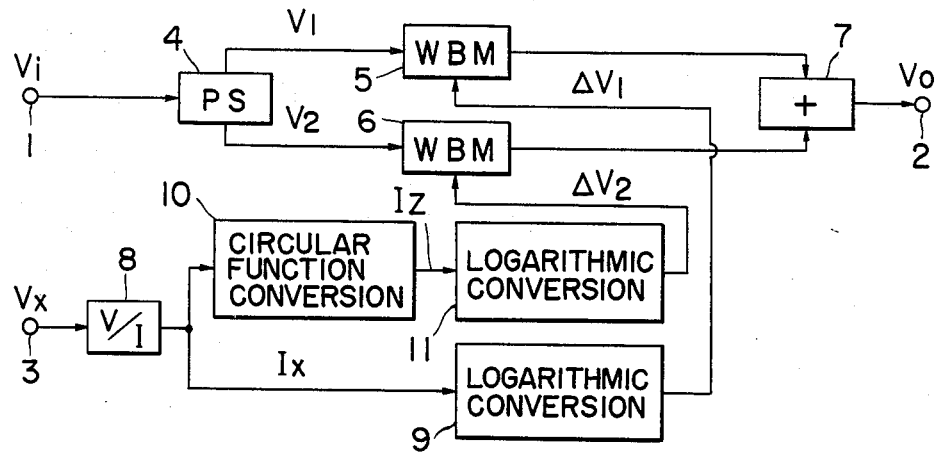
FIG. 1 is a block diagram illustrating an embodiment of a variable phase shifting circuit according to the present invention implemented as a voltage controlled phase shifting circuit.

An embodiment of a variable phase shifting circuit according to the present invention will be described in detail with reference to the attached drawings. FIG. 1 is a block diagram illustrating an example of the configuration of a variable phase shifting circuit according to the present invention implemented as a voltage controlled phase shifting circuit. This phase shifting circuit includes a signal input terminal 1, a signal output terminal 2, an input terminal 3 for the control voltage, a phase splitter 4, double balanced differential amplifiers 5 and 6, a summer 7, a voltage-to-current converter 8, logarithmic conversion means 9 and 11, and circular function conversion means 10.

The phase splitter 4 responds to the input signal $V_i$ delivered through the input terminal 1 to generate two signals $V_1$ and $V_2$ which are 90 degrees out of phase to output them. One signal $V_1$ of the two signals $V_1$ and $V_2$ output from the phase splitter 4 is delivered to the first double balanced differential amplifier 5 as an input signal. The other signal $V_2$ thereof is delivered to the second double balanced differential amplifier 6.

The double balanced differential amplifier 5 is subjected to gain control by a control voltage $\Delta V_1$ delivered thereto. The double balanced differential amplifier 6 is subjected to gain control by a control voltage $\Delta V_2$ delivered thereto. Output signals from the first and second double balanced differential amplifiers 5 and 6 are subjected to vector summation at a summer 7. The summed value is output to the output terminal 2 as an output signal $V_o$.

The control voltage $V_x$ delivered to a voltage-to-current converter 8 through the input terminal 3 is converted to a current $I_x$ at the voltage-to-current converter 8. The current $I_x$ thus obtained is output to the logarithmic conversion means 9 and to the circular function conversion means 10. The current $I_x$ output from the voltage-to-current converter 8 is changed to a control voltage $\Delta V_1$ by the logarithmic conversion means 9. This control voltage $\Delta V_1$ is used for the gain control of the first double balanced differential amplifier 5. The current $I_x$ delivered to the circular function conversion means 10 is converted to a current $I_z$ defined by the relationship expressed as $I_x^2+I_z^2=$const. By causing the current $I_z$ to be delivered to the logarithmic conversion means 11, it is converted to a control voltage $\Delta V_2$ at the logarithmic conversion means 11. This control voltage $\Delta V_2$ is used for the gain control of the second double balanced differential amplifier 6. The detailed explanation of the conversion at the circular function conversion means 10 will be made later.

The first and second double balanced differential amplifiers 5 and 6 are subjected to the gain control by the control voltage $\Delta V_1$ and $\Delta V_2$, respectively. Thus, an output signal $V_o$ having a fixed amplitude is output within the range of a phase angle of ±90 degrees.

Figure 2:
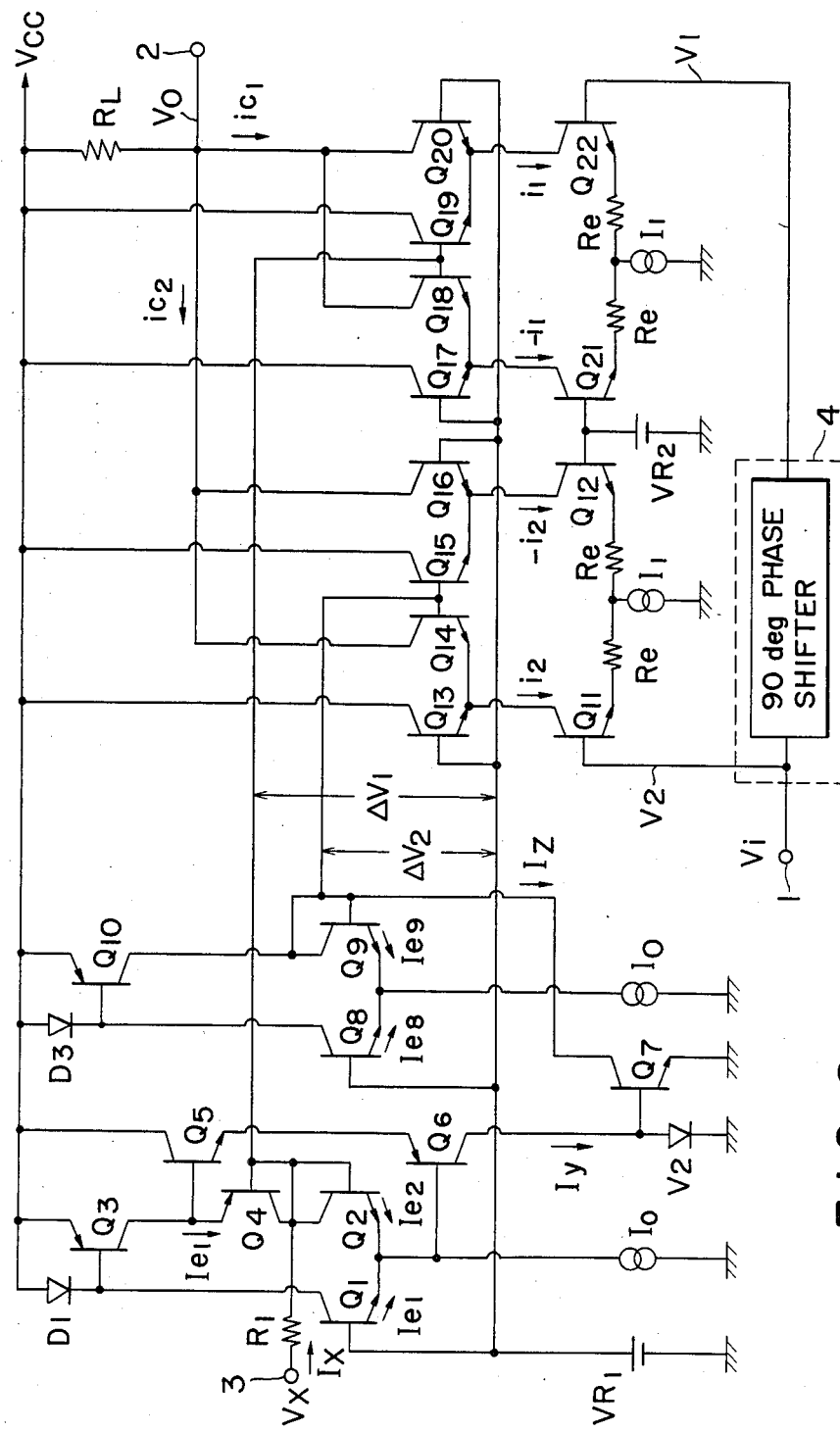
FIG. 2 is a circuit diagram illustrating an example of the configuration corresponding to the variable phase shifting circuit shown in FIG. 1 implemented as the voltage controlled phase shifting circuit.
Figure 7:
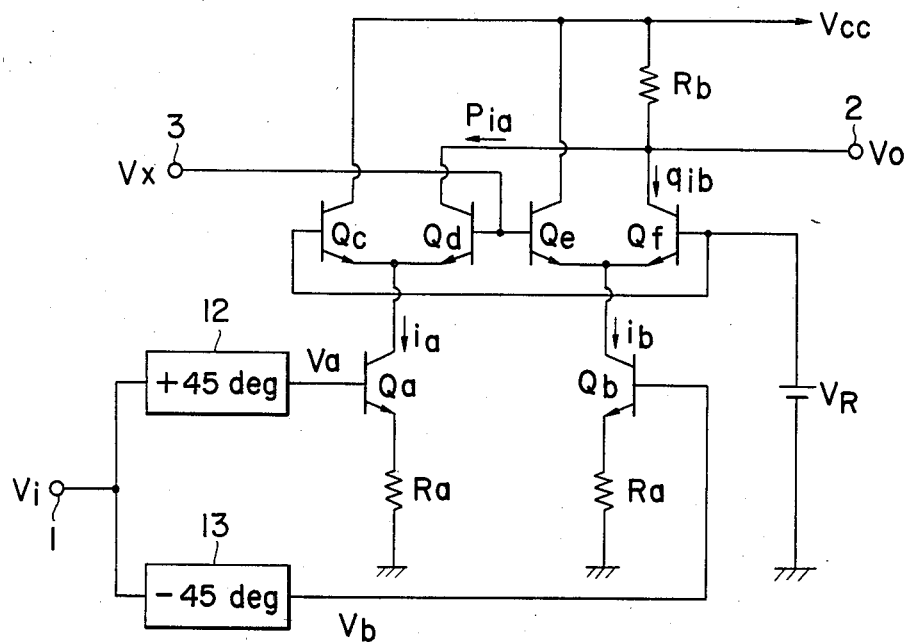
FIG. 7 is a circuit diagram illustrating an example of a variable phase shifting circuit of the background art.
Figure 8:
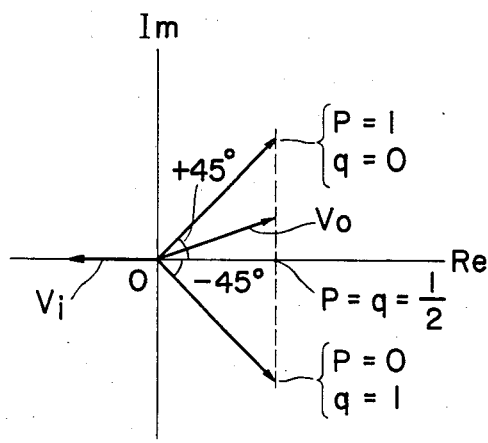
FIG. 8 is a vector diagram showing the operation of the variable phase shifting circuit shown in FIG. 7.

FIG. 2 is a circuit diagram illustrating an actual circuit arrangement of a variable phase shifting circuit according to the present invention implemented as a voltage controlled phase shifting circuit. In the arrangement shown in FIG. 2, a phase shifter of 90 degrees is used as the phase splitter 4. The first and second output signals $V_1$ and $V_2$ are output from the phase splitter 4. The first output signal $V_1$ has a phase difference of 90 degrees with respect to an input signal $V_i$ and the second output signal $V_2$ is in phase with the input signal $V_i$.

In the circuit arrangement shown in FIG. 2, the circuit configuration including transistors $Q_{17}$ to $Q_{22}$, two resistors $R_e$ and a current source 11 constitutes a well known double balanced differential amplifier. This double balanced differential amplifier corresponds to the first double balanced differential amplifier 5 in the voltage controlled phase shifting circuit shown in FIG. 1. The well known double balanced operational amplifier including transistors $Q_{11}$ to $Q_{16}$, two resistors $R_e$ and a current source 11 corresponds to the second balanced differential amplifier in the voltage controlled phase shifting circuit shown in FIG. 1. The first output signal $V_1$ of the two output signals output from the above-mentioned phase splitter 4 is delivered to the base of the transistor $Q_{22}$. The second output signal $V_2$ thereof is delivered to the base of the transistor $Q_{11}$.

To the base of the transistor 21 paired with the above-mentioned transistor $Q_{22}$ for constituting the differential amplifier and the base of the transistor $Q_{12}$ paired with the above-mentioned transistor $Q_{11}$ for constituting the differential amplifier, a reference bias voltage $V_{R2}$ from a reference bias power source VR2 is delivered. While the above-mentioned two signals $V_1$ and $V_2$ include the reference bias voltage $V_{R2}$ as a matter of cource, the indication of the circuit configuration therefor is omitted for the brevity of illustration.

The outputs of the first and second double balanced differential amplifiers 5 and 6 are output from the commonly connected collectors of the transistors $Q_{18}$ and $Q_{20}$ and the commonly connected collectors of the transistors $Q_{14}$ and $Q_{16}$ as output currents $i_{c1}$ and $i_{c2}$, respectively. The both output currents are summed at the commonly connected load resistor $R_L$. Thus, an output voltage $V_o$ is output to the output terminal 2.

The gain of the first double balanced differential amplifier 5 is controlled by the control voltage $\Delta V_1$ applied across the bases of the paired transistors $Q_{17}$ and $Q_{18}$ and across those of the paired transistors $Q_{19}$ and $Q_{20}$. Likewise, the gain of the second double balanced differential amplifier 6 is controlled by the control voltage $\Delta V_2$ applied across the bases of the paired transistors $Q_{13}$ and $Q_{14}$ and across those of the paired transistors $Q_{15}$ and $Q_{16}$.

In the circuit arrangement shown in FIG. 2, the circuit configuration including a resistor $R_1$, transistors $Q_1$ to $Q_4$, a diode $D_1$, a current source $I_o$, and a reference voltage source VR1 corresponds to the voltage-to-current converter 8 and the logarithmic conversion means 9 in the voltage controlled phase shifting circuit shown in FIG. 1. The control voltage $\Delta V_1$ determined with the reference voltage VR1 set at the reference voltage source VR1 being as reference is delivered from the collector of the transistor $Q_2$ to the control terminal of the first double balanced differential amplifier 5.

In the circuit arrangement shown in FIG. 2, the circuit configuration including transistors $Q_2$ and $Q_4$ to $Q_7$, and a diode $D_2$ constitutes the circular function conversion means 10 in the voltage controlled phase shifting circuit shown in FIG. 1. The circuit configuration including transistors $Q_8$ to $Q_{10}$, a diode $D_3$ and a current source $I_o$ constitutes the logarithmic conversion means 11 in the voltage controlled phase shifting circuit shown in FIG. 1. The control voltage $\Delta V_2$ determined with the reference voltage $V_{R1}$ set at the reference voltage source VR1 being as reference is delivered from the collector of the transistor $Q_9$ to the control terminal of the second double balanced differential amplifier 6.

In the circuit arrangement shown in FIG. 2, the control voltage $V_x$ applied to the input terminal 3 for the control voltage is determined with the reference voltage $V_{R1}$ set at the reference voltage source VR1 as reference. this control voltage $V_x$ is converted to a control current $I_x$ flowing into the collector of the transistor $Q_2$ (or flowing out from the collector of the transistor $Q_2$) through the resistor $R_1$.

Since the relationship between the control voltage $V_x$ and the reference voltage $V_{R1}$ is expressed as $\Delta V_1 << V_{R1}$, the above-mentioned control current $I_x$ is expressed as $I_x \approx (V_x - V_{R1})/R_1$. When the control current $I_x$ flows into the transistor $Q_2$, currents $I_{e1}$ and $I_{e2}$ flowing in the transistors $Q_1$ and $Q_2$ become differential currents expressed as the following equation (1), respectively:

$$I_{e1} = (I_o - I_x)/2$$
$$I_{e2} = (I_o + I_x)/2 \quad (1)$$

How the above-mentioned differential currents occur will be explained with reference to FIG. 3.

Figure 3:
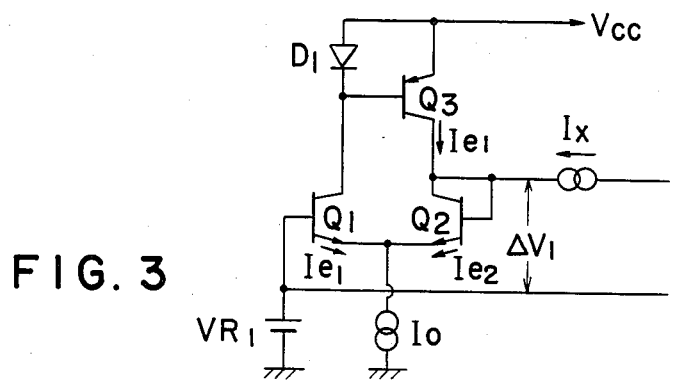
FIG. 3 is a circuit diagram for explanation of the generation of a differential currents.

In the circuit arrangement shown in FIG. 3, the circuit comprising the transistors $Q_1$ and $Q_2$ paired for constituting the differential amplifier and the current source $I_o$ and a current mirror circuit comprising the diode $D_1$ and the transistor $Q_3$ constitutes a well known differential amplifier operative with the current mirror circuit being as the load. The output of the differential amplifier obtained at the collector of the transistor $Q_2$ is fed back to the base of the transistor $Q_2$, which serves as the inverting input terminal of the differential amplifier. The reference voltage source VR1 is connected to the base of the transistor $Q_1$, which serves as the non-inverting input terminal of the differential amplifier.

In the circuit arrangement shown in FIG. 3 thus configured, since a current flowing in the transistor $Q_3$ of the current mirror circuit is equal to a current $I_{e1}$ flowing in the transistor $Q_1$ paired with the transistor $Q_2$ for constituting the differential amplifier, the current $I_{e1}$ flowing in the transistor $Q_1$, the current $I_{e2}$ flowing in the transistor $Q_2$, and the control current $I_x$ flowing into the transistor $Q_2$ have the relationship expressed as $I_x + I_{e1} = I_{e2}$ by the nodal equation in the collector and the emitter of the transistor $Q_2$. In addition, the current $I_{e1}$ flowing in the transistor $Q_1$, the current $I_{e2}$ flowing in the transistor $Q_2$, and the current $I_o$ of the current source $I_o$ have the relationship expressed as $I_{e1} + I_{e2} = I_o$. Accordingly, the above-mentioned equation (1) is derived from these relationships. It is seen that the respective currents $I_{e1}$ and $I_{e2}$ flow as the differential currents.

In the voltage controlled phase shifting circuit shown in FIG. 2, the current $I_{e1}$ of the transistor $Q_3$ flows into the transistor $Q_2$ through the PNP transistor $Q_4$ of which base and collector are connected. Also in this case, the circuit operation is the same in that the above-mentioned differential currents are produced.

In the circuit arrangement shown in FIG. 2, the operation of the circuit configuration corresponding to the voltage-to-current converter 8 and the logarithmic conversion means 9, i.e., the logarithmic conversion means in the circuit configuration including the resistor $R_1$, the transistors $Q_1$ to $Q_4$, the diode $D_1$, the current source $I_o$, and the reference voltage source VR1 will be now explained.

In the circuit arrangement shown in FIG. 2, the output $\Delta V_1$ corresponding to the output of the logarithmic conversion means 9 in the voltage controlled phase shifting circuit shown in FIG. 1, i.e., the control voltage $\Delta V_1$ is obtained from the collector (base) of one transistor $Q_2$ of the transistor pair for constituting the differential amplifier with the reference voltage $V_{R1}$ of the reference voltage source VR1 being as reference. Assuming now that the base-emitter voltages of the transistors $Q_1$ and $Q_2$ paired for constituting the differential amplifier are designated by $V_{BE1}$ and $V_{BE2}$, respectively, the above-mentioned control voltage $\Delta V_1$ is expressed by the following equation:

$$\Delta V_1 = V_{BE2} - V_{BE1} \quad (2)$$
$$= V_T \ln(I_o + I_x)/(I_o - I_x),$$

where $V_T$ denotes a thermal voltage of the junction in the above equation (2), which is expressed as $V_T = KT/q$ (K, T and q represent Boltzman's factor, absolute temperature and charge of electron).

As obvious from the above equation (2), the control voltage $\Delta V_1$ is regarded as a voltage obtained by applying logarithmic conversion to the control current $I_x$.

The operation of the circular function conversion means will be now explained. In the circuit arrangement shown in FIG. 2, the circuit configuration including the transistors $Q_2$, $Q_4$ to $Q_7$, and the diode $D_2$ constitutes the circular function conversion means 10 in the voltage controlled phase shifting circuit shown in FIG. 1. In FIG. 2, the base of the NPN transistor $Q_5$ is connected to the emitter of the transistor $Q_4$. The base of the PNP transistor $Q_6$ is connected to the emitters of the transistors $Q_7$ and $Q_2$ paired for constituting the differential amplifier. In addition, emitters of the transistors $Q_5$ and $Q_6$ are connected to each other.

Assuming now that the base-emitter voltages of the transistors $Q_4$, $Q_5$ and $Q_6$ are designated by $V_{BE4}$, $V_{BE5}$ and $V_{BE6}$, respectively, the following equation (3) holds in connection with the base-emitter voltages of the transistors $Q_5$ and $Q_6$:

$$V_{BE5} + V_{BE6} = V_{BE4} + V_{BE2} \quad (3).$$

Here, further assuming that a current flowing in the transistors $Q_5$ and $Q_6$ is designated by $I_y$, the base-emitter voltages $V_{BE}$ of respective transistors are expressed by the following equation (4):

$$\begin{aligned} V_{BE4} &= V_T \ln(I_{e1}/I_{s2}), \\ V_{BE2} &= V_T \ln(I_{e2}/I_{s1}), \\ V_{BE5} &= V_T \ln(I_y/I_{s1}), \text{ and} \\ V_{BE6} &= V_T \ln(I_y/I_{s2}) \end{aligned} \quad (4)$$

where $I_{s1}$ and $I_{s2}$ denote saturation currents of the NPN transistor $Q_5$ and the PNP transistor $Q_6$, respectively. As previously described, the currents $I_{e1}$ and $I_{e2}$ flow in the transistors $Q_4$ and $Q_2$, respectively.

Thus, when substitution of the equation (4) into the equation (3) is carried out and arrangement is made using the equation (1), the following equation (5) is obtained:

$$I_y = \sqrt{I_{e1} \cdot I_{e2}} = (\sqrt{I_o^2 - I_x^2})/2. \quad (5)$$

The current $I_y$ is amplified by the current mirror circuit comprising the diode $D_2$ and the transistor $Q_7$ and is then output as a current $I_z$. Assuming that the junction area ratio of the transistor $Q_7$ and the diode $D_2$ is two to one, the relationship between the currents $I_z$ and $I_y$ is expressed as $I_z = 2I_y$. Accordingly, from the equation (5), the current $I_z$ is expressed as follows:

$$I_z = \sqrt{I_o^2 - I_x^2}. \quad (6)$$

Figure 4:
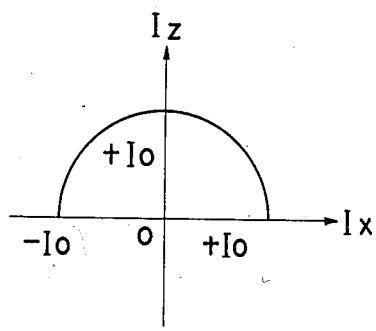
FIG. 4 is a conversion characteristic diagram of the circular function conversion means.

Namely, $I_z$ is the circular function of $I_x$. Thus, the current $I_z$ changes so as to trace a semicircular locus, e.g., such that when $I_x = 0$, $I_z = +I_o$, and when $I_x = \pm I_o$, $I_z = 0$, according as $I_x$ changes, as shown in FIG. 4.

As previously described, the current $I_z$ which has undergone the circular function conversion is converted, at the logarithmic conversion means 11, to the differential currents $I_{e8}$ and $I_{e9}$ as explained with reference to the circuit shown in FIG. 3 and is then subjected to logarithmic conversion. A control voltage $\Delta V_2$ determined with the reference voltage $V_{R1}$ of the reference voltage source VR1 being as reference is output from the logarithmic conversion means 11 as indicated by the following equation (7):

$$\Delta V_2 = V_T \ln\{(I_o - I_z)/(I_o + I_z)\} \quad (7).$$

The phase control operation of the voltage controlled phase shifting circuit shown in FIG. 2 will be now explained. An explanation will be made only in connection with the signal components excluding the bias voltage or current components (dc component) for the brevity of explanation. In the circuit arrangement shown in FIG. 2, an input signal $V_1$ input to the first double balanced differential amplifier 5 is subjected to current conversion thereat. Thus, signal currents $i_1$ and $-i_1$ flow in the transistors $Q_{22}$ and $Q_{21}$, respectively. These signal currents $i_1$ and $-i_1$ flow in the load resistor $R_L$ as the current $i_{c1}$ on the basis of the operation of the circuit comprising the transistors $Q_{17}$ to $Q_{20}$ of which branch ratio m is controlled by the control voltage $\Delta V_1$.

Similarly, an input signal $V_2$ is subjected to current conversion at the second double balanced differential amplifier 6. Thus, signal currents $i_2$ and $i_2$ flow in the transistors $Q_{11}$ and $Q_{12}$, respectively. These signal currents $i_2$ and $-i_2$ flow in the load resistor $R_L$ as a current $i_{c2}$ on the basis of the operation of the circuit comprising transistors $Q_{13}$ to $Q_{16}$ of which branch ratio n is controlled by the control voltage $\Delta V_2$. As a result, a summed current of the currents $i_{c1}$ and $i_{c2}$ flows in the load resistor $R_L$. Thus, an output signal $V_o$ is output. The following equations hold in connection with these signal currents and the output voltage:

$$i_1 = V_1/2R_e, i_2 = V_2/2R_e \quad (8)$$

$$i_{C1} = (1 - 2m)i_1, i_{c2} = (2n - 1)i_2 \quad (9),$$

and $$V_o = -R_L(i_{c1} + i_{c2}) \quad (10).$$

Substitution of the equations (8) and (9) into the equation (10) gives $$V_D = R_L/2R_e\{(2m-1)V_1 + (1-2n)V_2\} \quad (11)$$

Here, complex representation of $V_1$ and $V_2$ in regard to $V_i$ gives $$V_1 = jV_i, V_2 = V_i \quad (12)$$

Since the branch ratios m and n are expressed as $m = 1/\{(1 + \exp(-\Delta V_1/V_T)\}$ and $n = 1/\{1 + \exp(-\Delta V_2/V_T)\}$, respectively, the following relationships are derived from the equations (2) and (7):

$$2m - 1 = I_x/I_o, 1 - 2n = I_z/I_o \quad (13).$$

Substitution of the equations (12) and (13) into the equation (11) gives $$V_o = V_i R_L/2R_e\{(I_z/I_o) + j(I_x/I_o)\} \quad (14).$$

In the above equation (14), the amplitude of the output voltage $V_o$ is expressed as $V_i R_L/2R_e \cdot \sqrt{(I_z/I_o)^2 + (I_x/I_z)^2}$ and the phase $\Phi$ are expressed as $\Phi = \tan^{-1}(I_x/I_z)$. When polar coordinate representation is made using the relationship of the equation (6), because of $\sqrt{(I_z/I_o)^2}$ $+(I_x/I_o)^2=1$, the output voltage $V_o$ is expressed as follows:

$$V_o = V_i R_L / 2R_e < \Phi \quad (15)$$

where $$\Phi = \tan^{-1} I_x / \sqrt{I_o^2 - I_x^2}.$$

Figure 5:
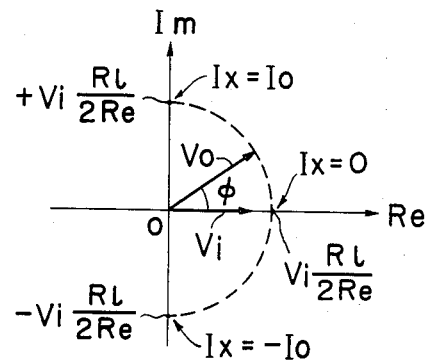
FIG. 5 is a vector diagram showing the operation of the variable phase shifting circuit according to the present invention.

As obvious from the equation (15), the amplitude of the output signal $V_o$ is fixed irrespective of the control current $I_x$, and the phase thereof can be changed in accordance with the change of the control current $I_x$ within a range from +90 to −90 degrees as shown in FIG. 5. Accordingly, the circuit configured as shown in FIG. 2 operates as a voltage controlled phase shifter which is fixed at its output amplitude but is variable at its phase by the control voltage $V_x$.

Another embodiment of a control circuit according to the present invention will be now explained with reference to FIG. 6. Namely, FIG. 6 shows another embodiment of the circuit configuration of the voltage-to-current converter 8, the logarithmic conversion means 9 and the circular function conversion means 10 in the voltage controlled phase shifting circuit of the first embodiment shown in FIG. 1. In the circuit arrangement shown in FIG. 6, the circuit configuration including transistors $Q_{23}$ and $Q_{24}$ paired for constituting the differential amplifier, two current sources $I_o$, and a resistor $R_2$ is a well known differential amplifier. This portion constitutes the voltage-to-current converter 8. A control voltage $V_x$ is input to the base of the transistor $Q_{23}$ through the input terminal 3, and the reference voltage $V_{R3}$ set at the reference voltage source VR3 is applied to the base of the transistor $Q_{24}$. In the circuit arrangement shown in FIG. 6, a reference voltage source VR4 is commonly connected to the bases of transistors $Q_{25}$ and $Q_{26}$ which constitute the logarithmic conversion means, and a control voltage $\Delta V_1$ appears across the emitters of the transistors $Q_{25}$ and $Q_{26}$.

In the circuit arrangement shown in FIG. 6, a current mirror circuit composed of a diode $D_4$ and a transistor $Q_{27}$ and a circuit composed of transistors $Q_{26}$ and $Q_{28}$ to $Q_{31}$, and a diode $D_5$ constitute the circular function conversion means 10, thus to output from the transistor 31 a current $I_z$ which has been converted to the circular function. The operation of the circuit shown in FIG. 6 is as follows.

In the circuit arrangement shown in FIG. 6, a conversion current $I_x$ corresponding to the control voltage $V_x$ flows in the resistor $R_2$ due to the well known characteristic of the differential amplifier. Thus, current $I_{e25}$ and $I_{e26}$ flowing in the transistors $Q_{25}$ and QHD 26 becomes differential currents expressed as $I_{e25}=I_o+I_x$ and $I_{e26}=I_o-I_x$, respectively.

Thus, as is well known, the base-emitter voltages $V_{BE}$ of the transistors $Q_{25}$ and $Q_{26}$ vary, and the control voltage $\Delta V_1$ expressed as the equation (2) as its difference voltage is obtained across the both emitters.

Based on the well known characteristic of the current mirror circuit, a current equal to the current $I_{e25}$ flowing in the transistor $Q_{25}$ is output from the transistor $Q_{27}$. The current thus output flows in the transistor $Q_{28}$. In this instance, since the bases and the collectors of the transistors $Q_{28}$ and $Q_{26}$ are commonly connected to the reference voltage source VR4, the sum of the base-emitter voltages $V_{BE28}$ and $V_{BE26}$ of the transistors $Q_{28}$ and $Q_{26}$ is applied across the bases of the transistors $Q_{29}$ and $Q_{30}$. Thus, a current flowing in the transistors $Q_{29}$ and $Q_{30}$ is expressed as $I_y=\sqrt{I_o^2-I_x^2}$ in the same manner as having been explained in connection with the circuit arrangement shown in FIG. 2.

When respective junction areas of the diode $D_5$ and the transistor $Q_{31}$ in the current mirror circuit composed of the diode 5 and the transistor $Q_{31}$ are caused to be equal to each other, the output currents $I_z$ and $I_y$ become equal to each other and the output current $I_z$ is expressed as $I_z=\sqrt{I_o^2-I_x^2}$. Also in the circuit arrangement shown in FIG. 6, the current $I_z$ output from the transistor $Q_{31}$ becomes an output which has undergone the circular function conversion in the same manner as in the case of the circuit arrangement shown in FIG. 2.

In the above-mentioned embodiments, it has been only described that the variable phase shifting circuit according to the present invention is configured as the voltage controlled phase shifting circuit. However, in the implementation of the variable phase shifting circuit according to the present invention, when there is employed an arrangement such that the phase control is effected using a control input current instead of the voltage-to-current converter, the variable phase shifting circuit may be implemented as the current controlled phase shifter. In addition, in the implementation of the variable phase shifting circuit, there may be employed a phase splitter to output two signals which are phase-shifted, for example, by ±45 degrees. In such a case, while the central value of the phase of the output signal is shifted by a suitable value with respect to the input, it is needless to say that the manner of the phase control is the same as in the above-mentioned embodiments.

Advantages With the Invention

As obvious from the foregoing detailed description, the variable phase shifting circuit according to the present invention comprises a phase splitter for distributing an input signal into first and second signals which are 90 degrees out of phase to output them, a first double balanced differential amplifier to which a first output signal from the phase splitter is delivered as an input signal, a second double balanced differential amplifier to which a second output signal from the phase splitter is delivered as an input signal, a summer for summing respective output signals from the first and second double balanced differential amplifier to output the summed result, a converter for converting a control input to differential currents, first logarithmic conversion means for converting an output current of the converter to a logarithmic voltage, circular function conversion means for converting the output current of the converter to a circuit function, and second logarithmic conversion means for converting an output current of the circular function conversion means to a logarithmic voltage, thus to control the gain of the first double balanced differential amplifier using an output from the first logarithmic conversion means, and to control the gain of the second double balanced differential amplifier using an output from the second logarithmic conversion means, thereby to provide a phase controlled output signal from the summer. Accordingly, in accordance with the present invention, by changing the control input in directions of positive and negative going swings with respect to the reference voltage, under condition where the amplitude of the output signal remains fixed, it is possible to easily realize a variable phase shifting circuit capable of changing the phase within a range of ±90 degrees. Thus, the present invention can advantageously solve problems with the above-described variable phase shifting circuit of the background art.

What is claimed is:

1. A variable phase shifting circuit comprising a phase splitter for distributing an input signal supplied thereto into first and second output signals which are outputted therefrom and 90 degrees out of phase each other, a first double balanced differential amplifier to which the first output signal from said phase splitter is delivered as a first input signal, a second double balanced differential amplifier to which the second output signal from said phase splitter is delivered as a second input signal, a summer for summing the respective first and second output signals from said first and second double balanced differential amplifiers to output the summed result, a converter for converting a control input supplied thereto to a differential current, first logarithmic conversion means for converting said differential current of said converter to a first logarithmic voltage, circular function conversion means for converting said differential current of said converter to a circular function current, and second logarithmic conversion means for converting said circular function current of said circular function conversion means to a second logarithmic voltage, thus to control the gain of said first double balanced differential amplifier responsive to said first logarithmic voltage, and to control the gain of said second double balanced differential amplifier responsive to said second logarithmic voltage, thereby to provide a phase controlled output signal from said summer.

2. A variable phase shifting circuit as set forth in claim 1, wherein there is employed, as said circular function conversion means, circuit means provided with means for converting an input current to differential currents varying with respect to a reference current, two PN-junctions through which said differential currents flow, respectively, and a series connected circuit comprising an NPN transistor and a PNP transistor of which emitters are connected to each other, a summed voltage of said two PN-junctions being applied across the respective bases of said transistors, thus to output a current from at least one of the collectors of said NPN transistor and said PNP transistor.

3. A variable phase shifting circuit as set forth in claim 1, wherein said phase splitter is constituted with a single phase shifter.

4. A variable phase shifting circuit as set forth in claim 1, wherein said converter, said logarithmic conversion means and said circular function conversion means are powered through a current mirror circuit.

* * * * *